United States Patent [19]

Cray et al.

[11] 3,832,603

[45] Aug. 27, 1974

[54] INTERCONNECT TECHNIQUE FOR STACKED CIRCUIT BOARDS

[75] Inventors: Seymour R. Cray; Maurice D. Roush, both of Chippewa Falls, Wis.

[73] Assignee: Control Data Corporation, Minneapolis, Minn.

[22] Filed: Mar. 9, 1973

[21] Appl. No.: 339,673

[52] U.S. Cl. ........ 317/101 D, 317/101 CC, 339/255
[51] Int. Cl. .......................................... H05k 5/00
[58] Field of Search.. 307/101 CC, 101 D, 101 CM; 339/255

[56] References Cited

UNITED STATES PATENTS 3,257,708 6/1966 Stricker ........................ 317/101 CC

FOREIGN PATENTS OR APPLICATIONS 1,280,356 10/1968 Germany ........................ 317/101 D
1,152,703 5/1969 Great Britain ...................... 339/255

OTHER PUBLICATIONS

Chapman et al., "Microelectronic Packaging Technique", IBM Tech. Disc. Bull., Vol. 6, No. 10, March 1964, pp. 70–71.

Cunaveus et al., "External Module Heat Sink Fastened to Board", IBM Tech. Bull., Vol. 14, No. 1, June 1961, p. 182.

*Primary Examiner*—David Smith, Jr.
*Attorney, Agent, or Firm*—Robert M. Angus; Joseph A. Genovese

[57] ABSTRACT

Circuit elements on circuit boards of a stacked assembly are electrically interconnected by interconnect devices located in a pseudo-random array on the boards. The interconnect devices include rigid, elongated members extending through the region separating adjacent circuit boards and assembled to receiver means, such as recesses, located in housings supported by an adjacent circuit board.

11 Claims, 7 Drawing Figures

INTERCONNECT TECHNIQUE FOR STACKED CIRCUIT BOARDS

This invention relates to assembly and fabrication techniques, and particularly to the manufacture of printed circuit board assemblies and modules containing a plurality of printed circuit boards.

The term "printed circuit board," as used herein means any planar board, panel, or other type of support, constructed of insulative, conductive or semiconductive material, supporting circuit connections manufactured by etching, spraying, deposition, embossing or any other additive or subtractive technique to form circuit conductors on the board. The term "printed circuit board" includes hand and machine-wired boards containing "stitched" wires laced through apertures in the board and supported thereon. The board may or may not include circuit components, such as integrated circuits and discreet circuit elements supported on the board and connected to one or more circuit conductors.

Printed circuit boards are used in a wide variety of electronic equipment. Such boards ordinarily provide high density packaging of electronic equipment and are used where space limitations are prevalent. The electrical conductors supported on the board make connection between electrical elements or integrated circuits supported on the board to form complete electric circuits. For example, in electronic calculators, computers, and the like, a large number of such circuit boards are stacked in parallel spaced relation and are utilized for the logic circuitry of the data assimilation and computation portions of the apparatus. Circuit components are mounted to at least one surface of each circuit board and occupy a portion of the region between the boards. Heretofore, components on one board have been connected to components on other boards by edge connectors connected to a conductor on each of the two boards. Thus, conductors on each board extended to an edge portion of such boards and were connected together by an electrical connector positioned outside of the stack of boards.

One problem associated with printed circuit boards having interconnections at an edge portion thereof resided in the fact that relatively long conductive paths were established between circuit elements on different boards, such conductive paths extending across the respective circuit boards to their edges and through the edge connectors. While these relatively long conductive paths have not heretofore imposed a significant problem to electronic equipment, recent developments in the electronic calculator and computer fields have rendered it imperative to minimize the length of conductive paths to decrease delay of transmission of electric signals between circuit elements. For example, in extremely high speed computers conductive paths of only four inches or more can introduce serious time delays in the transmission of data, thereby reducing the overall speed of computation.

Another disadvantage of edge-connected circuit boards resides in the fact that if numerous connections are to be made between stacked circuit boards, the edge connectors themselves are cumbersome and costly.

Some attempts have been made to interconnect stacked circuit boards at locations other than the edge of such circuit boards. However, these attempts have not been altogether successful. Thus, in U.S. Pat. No. 3,197,766, issued July 27, 1965 to Stein et al. for "Stacked Circuit Boards" there is described an assembly of stacked circuit boards having connector rods extending through connector apertures through some or all of the boards to make connections between circuit elements of various boards. While the arrangement shown in the Stein et al patent was highly successful for interconnecting stacked circuit boards and reducing the number of edge connections, it was not possible to remove a circuit board from the center of the stack without disassembling the entire stack. Thus, in the event that a circuit board became faulty, as might be occasioned by defective component on the board, it was not possible to remove only the faulty circuit board without also disassembling the remaining boards of the stack. Instead, the rods had to be removed from all of the circuit boards, thereby disassembling the entire stack and necessitating reassemblage of the stack upon replacement and/or repair of the faulty board. Another problem associated with the Stein et al approach resided in the fact that the connector rods extended through the boards at locations dictated by the location of the connector apertures. This necessitated careful alignment of the apertures in a predetermined geometric pattern which was not always the most advantageous for lead connection, and created alignment problems during assembly of the stack of boards. Further the Stein et al approach is not adequate in situations where a large number of interconnections is required.

It is an object of the present invention to provide interconnect apparatus in which the conductors on boards of a stacked circuit board assembly are interconnected by connector means pseudo-randomly dispersed throughout the stack for optimum circuit connection between elements of adjacent or non-adjacent circuit boards.

Another object of the present invention is to provide interconnect apparatus for printed circuit boards in a stacked assembly in which interconnections are provided between two boards of the stack so that if it becomes necessary to remove a board, that board may be removed by disassembling it from only the next adjacent boards, without disassembling the entire stack.

It is yet another object of the present invention to provide interconnect apparatus for a stacked circuit board assembly for minimizing edge connections between circuits on different boards.

Yet another object, the present invention resides in the provision of an interconnect techniques for a stacked assembly of circuit boards which permits a greater number, at higher density, of interconnects than heretofore achieved.

In accordance with the present invention, an assembly of stacked printed circuit boards are arranged in spaced relation and are provided with a plurality of interconnect means located pseudo-random locations on each of the boards for selectively connecting printed circuits on one board with printed circuits on another board. Each of the interconnect means includes a first housing means mounted to one circuit board and a second housing means mounted to a second adjacent circuit board. The first housing means includes a substantially rigid, elongated member which extends through the region between the adjacent circuit boards and the second housing means includes means for receiving an end portion of the elongated member.

In accordance with one feature of the present invention, the housings mounted to the circuit boards are substantially identical and have, at one end thereof, the elongated member extending from one surface of a board, and at the other end thereof, the receiving means for receiving an elongated member from the opposite surface of the board. Thus, by utilizing a plurality of such interconnect housings mounted to successive boards in tandem, connection may be made between circuit elements of non-adjacent circuit boards.

In accordance with yet another feature of the present invention, the interconnect means are removably attached at the junctions between the housings thereby enabling disassembly of a selected board from a stack of circuit boards without disassembling the remaining boards.

The above and other features of this invention will be more fully understood from the following detailed description and the accompanying drawings, in which.

Figure 1:
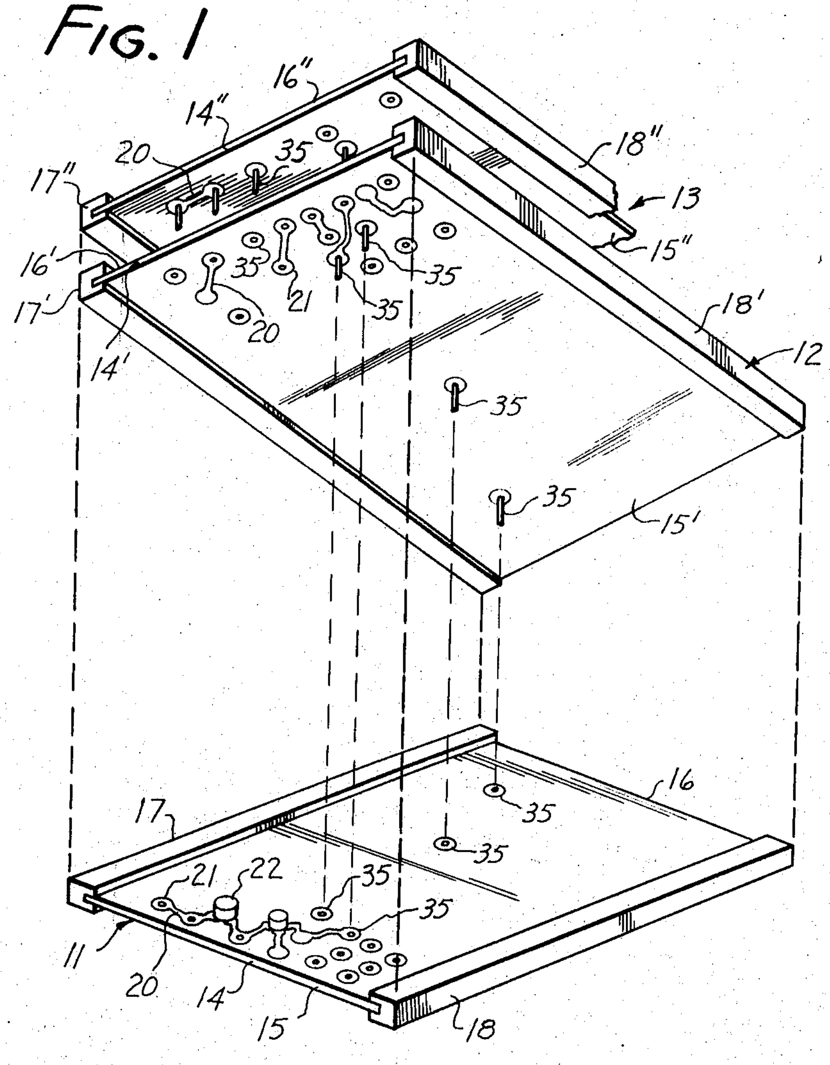
FIG. 1 is an orthogonal view of a stack of printed circuit boards having interconnect members in accordance with the presently preferred embodiment of the present invention, the stack being illustrated in a disassembled manner for purposes of illustration.

Referring to the drawings, there is illustrated a stack 10 containing a plurality of printed circuit boards 11, 12, 13. Each board includes a substantially planar support 14, 14', 14'' having opposite planar surfaces 15, 15', 15'' and 16, 16', and 16''. Although only three boards are shown in stack 10, it is to be understood that the stack may comprise as many as eighteen or more such printed circuit boards. Each board 14, 14', 14'' is preferably constructed of a suitable insulative material, but it is to be understood that the circuit board may be constructed of any suitable material including conductive and semi-conductive materials. Ordinarily, each board includes support means 17 and 18, 17' and 18', 17'' and 18'' extending along opposite edges of the respective board. As shown particularly FIG. 2, supports 17, 17', etc. 18, 18' etc. are so sized as to enable stacking of the supports to maintain the boards 14, 14', etc. in parallel spaced relationship.

Each board 14, 14', etc. includes an array of printed circuit conductors 20 extending between terminal pads 21 supported on one or both surfaces 14, 16 of each board. The circuit conductors 20 and pads 21 are supported on one or both surfaces 15, 16 of each board. The circuit conductors 20 and pads 21 are in a "pseudo-random" array determined by the most convenient conductor pattern for connecting circuit components 22 together to form a complete electric circuit. Circuit components 22 are attached to separate ones of pads 21. The circuit conductors 20 are constructed of conductive material and are supported on the boards in a well known manner. For example, the circuit conductors may be fabricated by any well known etching, spraying, deposition or electroplating technique. If the boards 14 are constructed of material other than an insulative material, a layer of insulative material on the board ordinarily will provide electrical isolation of conductors 20. Circuit elements 22 may comprise discreet components, such as packaged transistors, capacitors and/or resistors, or they may be packaged integrated or thin film circuits and components comprising a plurality of transistors, resistors and/or capacitors.

Each pad 21 preferably comprises a substantially cylindrical body 23 having end flanges 24 and 25 and a bore 27. Cylindrical body 23 is mounted in an aperture 26 through board 14 so that flanges 24 and 25 sandwich a portion of the board therebetween and the flanges 24 and 25 form a conductive portion on the surface of the board for connection to circuit conductors 20. Bore 27 in body 23 receives the conductive leads 28 of circuit element 22. Conveniently, the assemblage of leads 28 and bores 27 may be bonded by solder 29. The printed circuit conductors 20 may be formed on either, or both, surfaces 15 and 16 of any board 14, but it is preferred that components 22 be mounted only to one side of each board. The assemblage of leads 28 of components 22 to pads 21 provide support for the components.

Figure 2:
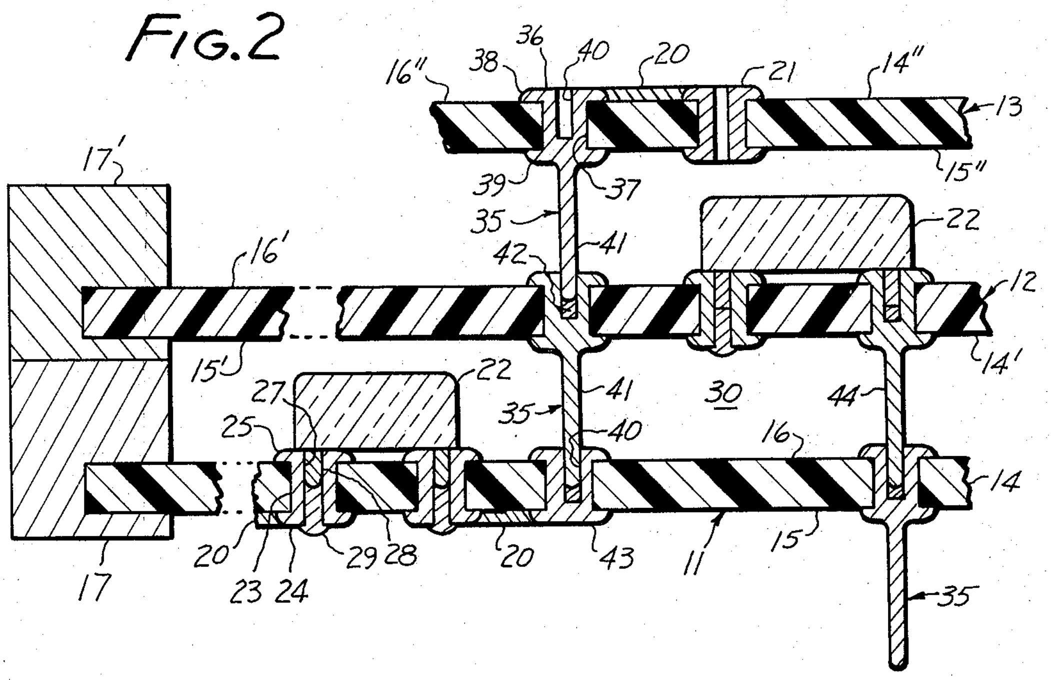
FIG. 2 is a side view elevation in cutaway cross-section of a portion of the stack of printed circuit boards shown in FIG. 1.

As shown particularly in FIG. 2, adjacent boards 14 and 14' are mounted in spaced relation to form a region 30 therebetween. The distance between adjacent boards is such that circuit components 22 on any one board are received in region 10 without mechanically or electrically interferring with the circuit portions of the next adjacent circuit board.

As shown in FIGS. 1 and 2, a plurality of interconnect devices 35 provide electrical connection between the selected circuit portions 20 and 21 on each board and the circuit portions on another board. Each interconnect device 35 includes a substantially cylindrical body 36 disposed in aperture 37 of a circuit board. Flanges 38 and 39 at each end of the cylindrical body 36 sandwich a portion of the board 14 therebetween. Each interconnect device further includes a bore 40 disposed in cylindrical body 36 and rigid elongated, pin-like mbmer 41 adapted to be received in the bore 40 of another interconnect device 35. Preferably, each member 41 includes a coating 42 of low-temperature solder, or the like, for bonding to the respective bore 40.

Interconnect devices 35 as illustrated in FIG. 1, are located in a "pseudo-random" array on the surfaces of the printed circuit boards. In this respect, the pattern of interconnect devices may vary from board to board with the sole criterion being that for each interconnect device having an elongated member 41 extending from one board, there is corresponding interconnect device having a bore 40 on the next adjacent board so as to enable reception of member 41. As used herein, the term "pseudo-random" as applied to the pattern of circuit elements and interconnect devices, means a pattern which does not necessarily have a geometric symmetry, but which is prescribed by the most convenient location for the circuit elements on each respective board and most convenient location for interconnect conductive paths between circuitry on different boards. The "most convenient" paths ordinarily will be of minimal length to assure short lead connections between circuit elements. For example, the conductor paths might be of the order of four inches, or less, as dictated by the circuit design and desired speed of operation. Of course longer paths may be desireable for certain applications, such as delay lines. It is understood that the length of the interconnect devices is included in the path length. Therefore, to accomplish the short paths, the interconnect devices will ordinarily be closely spaced to the corresponding circuit element, for example within about ½ inch.

Figure 3:
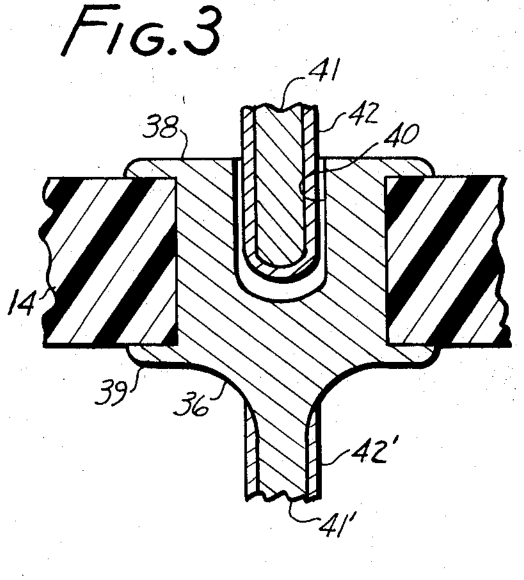
FIGS. 3 and 4 are enlarged section views of the junction between two interconnect members shown in FIGS. 1 and 2.
Figure 4:
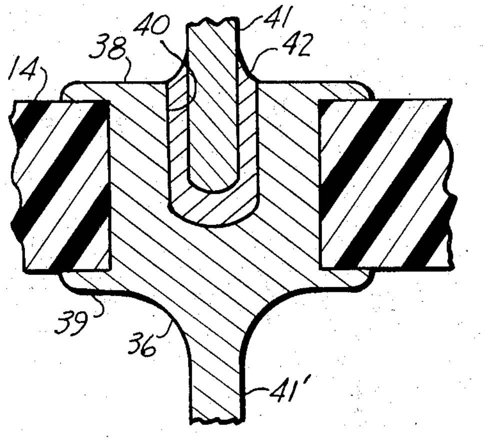

As shown particularly in FIG. 3, it is not necessary that circuits be interconnected between two adjacent boards. Thus, a plurality of interconnect devices 35 may be mounted in tandem through a plurality of boards to connect circuit elements 22 supported on boards which are not adjacent.

The number of interconnect devices mounted to any particular board may be quite high, for example as many as several thousands or more such devices on a 6 by 8 inch board. With the present invention a density of more than 250 such devices per square inch may be achieved, as contrasted to to the less than 10 interconnect rods per square inch achieved by the Stein et al., approach.

Members 41 are of such length as to extend across region 30 between adjacent circuit boards so that an end portion of the members 41 are received in a bore 41 of the interconnect device on the adjacent board. Also, as shown particularly with respect to interconnect device 43 illustrated in FIG. 2, the receiving interconnect devices which form the terminus of an interconnect path between circuit boards may be provided with a bore 40 but not with a member 41. Conveniently, the interconnect 43 illustrated in FIG. 2 may be fabricated merely by cutting off the member 41. A circuit element 22 may be directly connected to an interconnect as illustrated at 44.

To assemble circuit boards utilizing the interconnects in accordance with the present invention, the circuit elements 22 are joined to the members 23 and are preferably fixably attached thereto by a high-temperature solder or other suitable adhesive. Thereafter, the completed circuit boards are assembled into a stack as illustrated in FIGS. 1 and 2 so that an end portion of each member 41 is received in corresponding bore 40 of the interconnect device mounted to the next adjacent circuit board. Each member 41 is preferably coated with a low-temperature solder 42 or suitable adhesive, and heat is applied to entire assembly causing the solder 42 to flow thereby forming a bond between the member 41 and bore 40. By utilizing a high-temperature solder for connecting members 41 to bores 40, the bond between members 41 and bores 40 may be accomplished without affecting the bond between members 22 and 23.

The completed stack 10 of printed circuit boards thus forms circuits interconnected by interconnect devices 35 in a pattern forming the most convenient paths for electrical connection between circuit elements on adjacent and non-adjacent boards without the necessity of edge connections between circuit boards. Of course, it is to be understood that edge connections may be utilized, but the inclusion of interconnect devices in accordance with the present invention enables a substantial reduction in the number of edge connections between circuit boards and an attendant increase in circuit density.

In the event that a circuit element or other device on a particular board in the stack becomes faulty, the circuit board containing the faulty device may be removed by applying heat to the local interconnect devices coupling that circuit board to adjacent boards, thereby permitting the solder 42 to flow to enable disassemblage of the interconnect devices. Alternatively, the entire stack may be heated so that the interconnect devices connected to the faulty board may be disassembled selectively. Thus, only the faulty circuit board is removed from the stack thereby enabling its replacement or repair.

Figure 5:
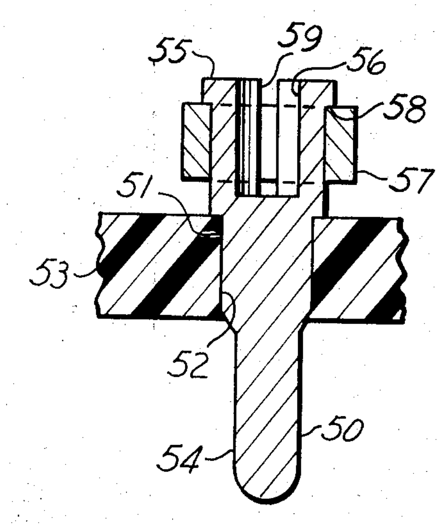
FIGS. 5 – 7 are views illustrating a modified interconnect member.
Figure 6:
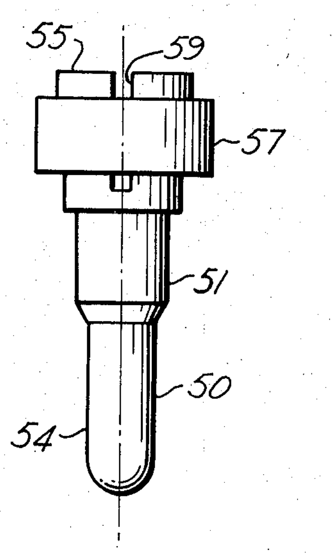
Figure 7:
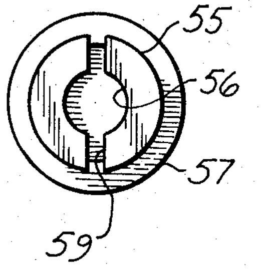

Referring to FIGS. 5 – 7, there is illustrated an interconnect member 50 according to a modification of the present invention, FIG. 5 being a sectional view, FIG. 6 being a side view and FIG. 7 being a top view thereof. Member 50 comprises a unitary member having a shank 51 adapted to be fastened or friction fitted in aperture 52 of circuit board 53. An elongated pin-like portion 54 extends from one end of shank 51, and a receptacle housing 55 extends from the opposite end thereof. Housing 55 includes an annular bore 56 so sized as to be normally larger than the cross-section of a pin-like portion 54. Housing 55 is cross-slotted by slot 59 thereby dissecting bore 56 to form opposite jaws. Sleeve 57 surrounds housing 55 and is held in place by shoulder 58.

Sleeve 55 is constructed of a suitable, thermally expansive metal capable of contracting and expanding when subjected to a temperature change. One convenient metal suitable for such purpose is known as "Thermally Deformable Metal," commercially available from Raychem Corp. of Menlo Park, Cal. This material is capable of contracting at a temperature of about −55°C (−67°F) thereby enlarging its bore permitting the jaws of housing 55 formed by slot 59 to separate to enable removal or insertion of pin portion 54. When the temperature of the material is raised to about +45°C (+ 113°F) the material expands to such a degree sufficient to reduce its bore to compress the jaws of housing 55, thereby closing bore 56 to provide an interference fit against pin 54. It should be noted that under most operating conditions, particularly in a computer where a large number of such printed circuit boards may be used, the ambient temperature surrounding the circuit board may be of the order of about +125°C (+257°F) so there is no risk that the boards will inadvertently separate. Further, suitable fastening means (not shown) are ordinarily included to hold the board in place.

The present invention thus provides an interconnect technique and apparatus for printed circuit boards whereby the most convenient circuit path between circuit elements on different boards may be achieved through interconnect members located at "pseudo random" locations about the circuit boards. The interconnect devices require minimal force to assemble and may be readily disassembled for overhaul, replacement or repair.

This invention is not to be limited by the embodiments shown in the drawings and described in the description, which are given by way of example and not of limitation, but only in accordance with the scope of the appended claims.

What is claimed is:

1. In a circuit board assembly comprising a plurality of substantially planar circuit boards each having printed circuit means supported on at least one planar surface thereof and having circuit devices connected to said respective printed circuit means and supported adjacent at least one planar surface of the respective board, said circuit boards being stacked in spaced relation to define regions between adjacent circuit boards, the improvement comprising: a plurality of electrically conductive interconnect means mounted to selected ones of said circuit boards; each of said interconnect means including housing means mounted to a respective circuit board, a substantially rigid, elongated member supported by each of said housing means and extending from one end of said housing means into the respective region between adjacent circuit boards, and a slotted, cylindrical bore in the opposite end of said housing means having opposite jaw members, an end portion of each of said elongated members being assembled to a respective bore in a respective interconnect means on an adjacent circuit board, thermally expandable means assembled to said housing means for deflecting said jaw members to selectively expand and contract said bore to selectively create an interference fit between said bore and an assembled elongated member, connecting means establishing electrical connection between each of said end portions and the respective bore; said interconnect means being arranged in pseudo-random arrays on planar surfaces of said circuit boards so that said end portions of said elongated members are assembled to respective bores on adjacent boards for selectively connecting printed circuit means on one circuit board with printed circuit means on another circuit board.

2. Apparatus according to claim 1 wherein said housing means each include a cylindrical portion mounted in an aperture in the respective circuit board, and flange means at each end of said cylindrical portion sandwiching a portion of the respective circuit board therebetween.

3. Apparatus according to claim 2 wherein said printed circuit means is connected to at least some of said housing means.

4. Apparatus according to claim 1 wherein said assembly includes at least first, second, and third circuit boards arranged in stacked relation so that said second circuit board is positioned between said first and third circuit boards, said apparatus including a first of said housing means mounted to said first circuit board, a second of said housing means mounted to said second circuit board, and a third of said housing means mounted to said third circuit board, said first, second and third housing means being aligned in a plane normal to the planes defined by said first, second and third circuit boards, said first housing means including an elongated member extending into the region between said first and second circuit boards and having an end portion assembled to a bore in said second housing means, and said second housing means including an elongated member extending into the region between said second and third circuit boards and having an end portion assembled to a bore in said third housing means, whereby said first housing means on said first circuit board is electrically connected to said third housing means on said third circuit board.

5. Apparatus according to claim 4 wherein said housing means each include a cylindrical portion mounted in an aperture in the respective circuit board, and flange means at each end of said cylindrical portion sandwiching a portion of the respective circuit board therebetween.

6. Apparatus according to claim 4 wherein said printed circuit means is connected to at least some of said housing means.

7. A circuit assembly comprising, in combination:

*a.* a plurality of individual printed circuit boards, each of said boards having at least two opposite planar surfaces, each of said boards including:
   i. a pattern of electrically conductive members supported on at least one of said planar surfaces, and
   ii. circuit means supported by said board adjacent at least one of said planar surfaces, said circuit means being electrically connected to selected portions of said conductive members;

b. assembly means supporting said plurality of boards in spaced, stacked relation so that the circuit means supported by each said board is spaced from the next adjacent board; and c. interconnect means electrically connecting selected ones of the conductive members on each board to respective ones of the conducting members on another board of the stack of boards, each of said interconnect means including:
   i. metallic housing means mounted in an aperture through the respective board and electrically connected to selected ones of said conductive members,
   ii. an elongated, rigid member extending from the housing means in one direction into the region between adjacent boards,
   iii. receiving means comprising a slotted, cylindrical bore in the housing means, said bore facing in a direction opposite from the elongated member and having opposite jaw members, an end portion of an elongated member of an interconnect means mounted to the next adjacent board being assembled to said bore,
   iv. thermally expandable means assembled to said receiving means for deflecting said jaw members to selectively expand and contract said bore to selectively create an interference fit between said bore and an assembled elongated member, and
   v. connecting means for establishing electrical connection between a bore and an assembled end portion;

said interconnect means being arranged in psuedo-random arrays on the planar surfaces of said boards.

8. An assembly according to claim 7 further including flange means at each end of said housing means sandwiching a portion of the board therebetween.

9. An assembly according to claim 7 wherein said circuit means is selected from the group consisting of discreet circuit elements and integrated circuits.

10. Apparatus according to claim 1 wherein said connecting means comprises flowable solder means.

11. Apparatus according to claim 7 wherein said connecting means comprises flowable solder means.

* * * * *

Dedication 3,832,603.—*Seymour R. Cray* and *Maurice D. Roush*, Chippewa Falls, Wis. INTERCONNECT TECHNIQUE FOR STACKED CIRCUIT BOARDS. Patent dated Aug. 27, 1974. Disclaimer filed Nov. 13, 1975, by the assignee, *Control Data Corporation*.

Hereby dedicates the entire term of said patent.

[*Official Gazette February 10, 1976.*]